(12) United States Patent
Chu et al.

(10) Patent No.: US 8,575,603 B2
(45) Date of Patent: Nov. 5, 2013

(54) PIXEL STRUCTURE OF AN ELECTROLUMINESCENT DISPLAY PANEL

(71) Applicant: AU Optronics Corp., Hsin-Chu (TW)

(72) Inventors: Miao-Tsai Chu, Hsin-Chu (TW); Meng-Ting Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/672,685

(22) Filed: Nov. 8, 2012

(65) Prior Publication Data
US 2013/0140535 A1 Jun. 6, 2013

(30) Foreign Application Priority Data

Dec. 5, 2011 (TW) .............................. 100144728 A

(51) Int. Cl.
*H01L 51/00* (2006.01)
(52) U.S. Cl.
USPC .................................... 257/40; 257/E51.022
(58) Field of Classification Search
USPC ........................................... 257/40, E51.022
See application file for complete search history.

(56) References Cited

U.S. PATENT DOCUMENTS

| 8,237,360 | B2 * | 8/2012 | Kinoshita | 313/506 |
|---|---|---|---|---|
| 2010/0133994 | A1 * | 6/2010 | Song et al. | 313/504 |
| 2011/0233528 | A1 * | 9/2011 | Levermore et al. | 257/40 |
| 2012/0212515 | A1 * | 8/2012 | Hamer et al. | 345/690 |
| 2012/0299002 | A1 * | 11/2012 | Kinoshita | 257/59 |
| 2013/0140533 | A1 * | 6/2013 | Lee et al. | 257/40 |
| 2013/0187138 | A1 * | 7/2013 | Matsumoto et al. | 257/40 |

OTHER PUBLICATIONS

Tian, Abstract of "Investigation of Microcavity Effects and Surface Plasmon Polaritons in Organic Electro-Optical Devices ", 2010.

* cited by examiner

*Primary Examiner* — Victor A Mandala
(74) *Attorney, Agent, or Firm* — Winston Hsu; Scott Margo

(57) ABSTRACT

A pixel structure of an electroluminescent display panel includes a first sub-pixel region, a second sub-pixel region, a third sub-pixel region and a fourth sub-pixel region having different cavity lengths. The first sub-pixel region and the second sub-pixel region share a first organic light-emitting layer, which can generate a first primary color light in the first sub-pixel region, and a second primary color light in the second sub-pixel region. The third sub-pixel region and the fourth sub-pixel region share a second organic light-emitting layer, which can generate a third primary color light in the third sub-pixel region, and a fourth primary color light in the fourth sub-pixel region. The first primary color light, the second primary color light, the third primary color light and the fourth primary color light have different spectra of wavelength.

18 Claims, 8 Drawing Sheets

PIXEL STRUCTURE OF AN ELECTROLUMINESCENT DISPLAY PANEL

BACKGROUND OF THE INVENTION

1. Field of the Invention

The present invention relates to a pixel structure of an electroluminescent display panel. More particularly, the pixel structure of the electroluminescent display panel includes four sub-pixel regions for displaying four different colors, and two adjacent sub-pixel regions share one organic light-emitting layer.

2. Description of the Prior Art

Due to its self-luminous, high contrast ratio, compact size and wide viewing angle properties, electroluminescent display panel e.g. organic light-emitting diode (OLED) display panel has been expected to prevail in the display market of next generation. The pixel structure of a conventional electroluminescent display panel is composed of three sub-pixel regions of three different colors such as red sub-pixel region, green sub-pixel region and blue sub-pixel region, and a full-color display effect is achieved by respectively controlling the gray values of red light, green light and blue light. Some colors, such as bright yellow color and golden color, are not within the color gamut composed of the three primary colors: red color, green color and blue colors. Therefore, the bright yellow color and golden color cannot be accurately displayed by the conventional electroluminescent display panel, which deteriorates color quality.

SUMMARY OF THE INVENTION

It is therefore one of the objections of the present invention to provide a pixel structure of an electroluminescent display panel to increase color gamut and color saturation.

According to a preferred embodiment, a pixel structure of an electroluminescent display panel having a first sub-pixel region, a second sub-pixel region, a third sub-pixel region and a fourth sub-pixel region is provided. The pixel structure of the electroluminescent display panel includes a first anode, a second anode, a third anode, a fourth anode, a first organic light-emitting layer, a second organic light-emitting layer, a first cathode, a second cathode, a third cathode and a fourth cathode. The first anode and the first cathode are disposed in the first sub-pixel region, and a first micro cavity is formed therebetween; the second anode and the second cathode are disposed in the second sub-pixel region, and a second micro cavity is formed therebetween; the third anode and the third cathode are disposed in the third sub-pixel region, and a third micro cavity is formed therebetween; and the fourth anode and the fourth cathode are disposed in the fourth sub-pixel region, and a fourth micro cavity is formed therebetween. The first micro cavity, the second micro cavity, the third micro cavity and the fourth micro cavity have different cavity lengths. The first organic light-emitting layer is disposed in the first sub-pixel region and the second sub-pixel region for generating a first primary color light in the first sub-pixel region and generating a second primary color light in the second sub-pixel region. The second organic light-emitting layer is disposed in the third sub-pixel region and the fourth sub-pixel region for generating a third primary color light in the third sub-pixel region and generating a fourth primary color light in the fourth sub-pixel region. The first primary color light, the second primary color light, the third primary color light and the fourth primary color light have different spectra of wavelength.

According to another preferred embodiment, a pixel structure of an electroluminescent display panel having a first sub-pixel region, a second sub-pixel region, a third sub-pixel region and a fourth sub-pixel region is provided. The pixel structure of the electroluminescent display panel includes a first anode, a second anode, a third anode, a fourth anode, a first organic light-emitting layer, a second organic light-emitting layer, a first cathode, a second cathode, a third cathode and a fourth cathode. The first anode and the first cathode are disposed in the first sub-pixel region, and a first micro cavity is formed therebetween; the second anode and the second cathode are disposed in the second sub-pixel region, and a second micro cavity is formed therebetween; the third anode and the third cathode are disposed in the third sub-pixel region, and a third micro cavity is formed therebetween; and the fourth anode and the fourth cathode are disposed in the fourth sub-pixel region, and a fourth micro cavity is formed therebetween. The first micro cavity, the second micro cavity, the third micro cavity and the fourth micro cavity have different cavity lengths. The first organic light-emitting layer is disposed in the first sub-pixel region for generating a first primary color light in the first sub-pixel region. The second organic light-emitting layer is disposed in the second sub-pixel region, the third sub-pixel region and the fourth sub-pixel region for generating a second primary color light in the second sub-pixel region, generating a third primary color light in the third sub-pixel region and generating a fourth primary color light in the fourth sub-pixel region. The first primary color light, the second primary color light, the third primary color light and the fourth primary color light have different spectra of wavelength.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
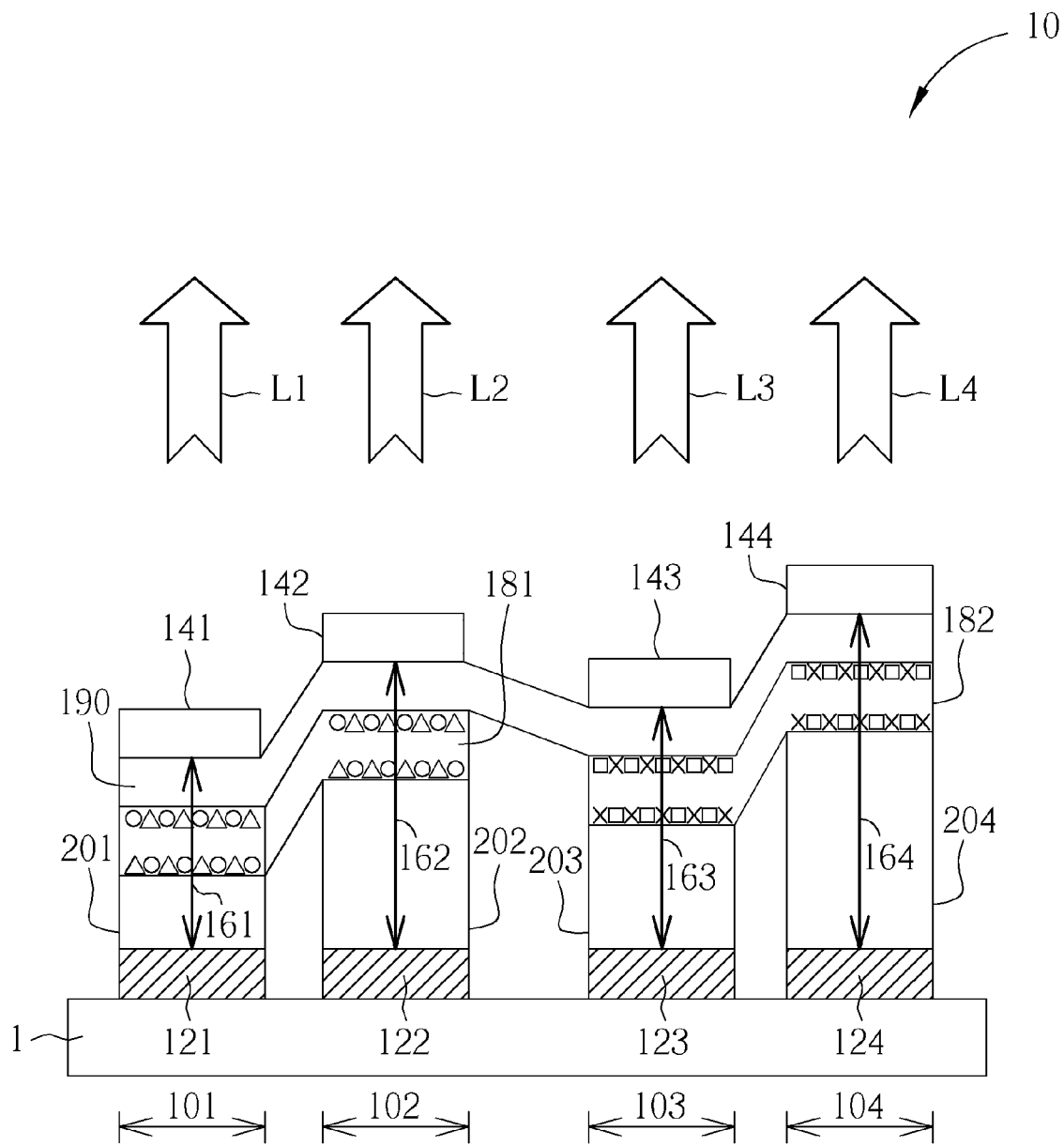
FIG. 1 is a schematic diagram illustrating a pixel structure of an electroluminescent display panel according to a first preferred embodiment of this invention.

Please refer to FIG. 1. FIG. 1 is a schematic diagram illustrating a pixel structure of an electroluminescent display panel according to a first preferred embodiment of this invention. As shown in FIG. 1, the pixel structure of the electroluminescent display panel 10 of this embodiment has a first sub-pixel region 101, a second sub-pixel region 102, a third sub-pixel region 103 and a fourth sub-pixel region 104 for displaying light of different colors, respectively. To be precise, the pixel structure of the electroluminescent display panel 10 may at least comprise a first sub-pixel region 101, a second sub-pixel region 102, a third sub-pixel region 103 and a fourth sub-pixel region 104, or may consist of a first sub-pixel region 101, a second sub-pixel region 102, a third sub-pixel region 103 and a fourth sub-pixel region 104. The first sub-pixel region 101, the second sub-pixel region 102, the third sub-pixel region 103 and the fourth sub-pixel region 104 can be arranged side by side, i.e. the first sub-pixel region 101 and the second sub-pixel region 102 are disposed adjacently, the second sub-pixel region 102 and the third sub-pixel region 103 are disposed adjacently, and the third sub-pixel region 103 and the fourth sub-pixel region 104 are disposed adjacently, but not limited thereto. The pixel structure of the electroluminescent display panel 10 includes a substrate 1, a first anode 121, a second anode 122, a third anode 123, a fourth anode 124, a first cathode 141, a second cathode 142, a third cathode 143 and a fourth cathode 144. The first anode 121 and the first cathode 141 are disposed in the first sub-pixel region 101, and a first micro cavity 161 is formed between the first anode 121 and the first cathode 141 in the first sub-pixel region 101. The second anode 122 and the second cathode 142 are disposed in the second sub-pixel region 102, and a second micro cavity 162 is formed between the second anode 122 and the second cathode 142 in the second sub-pixel region 102. The third anode 123 and the third cathode 143 are disposed in the third sub-pixel region 103, and a third micro cavity 163 is formed between the third anode 123 and the third cathode 143 in the third sub-pixel region 103. The fourth anode 124 and the fourth cathode 144 are disposed in the fourth sub-pixel region 104, and a fourth micro cavity 164 is formed between the fourth anode 124 and the fourth cathode 144 in the fourth sub-pixel region 104. The first micro cavity 161, the second micro cavity 162, the third micro cavity 163 and the fourth micro cavity 164 have different cavity lengths. In this embodiment, the electroluminescent display panel is a top emission type electroluminescent display panel, each of the first cathode 141, the second cathode 142, the third cathode 143 and the fourth cathode 144 includes a transflective electrode, and each of the first anode 121, the second anode 122, the third anode 123 and the fourth anode 124 includes a reflective electrode. The transflective electrode may be e.g. a thin metal electrode, and the reflective electrode may be e.g. a thick metal electrode, but not limited thereto. The first cathode 141, the second cathode 142, the third cathode 143 and the fourth cathode 144 may be electrically connected to each other and driven by the same common voltage, or electrically disconnected from one another and driven by different voltages.

The pixel structure of the electroluminescent display panel 10 further includes a first organic light-emitting layer 181 and a second organic light-emitting layer 182. The first organic light-emitting layer 181 is disposed in the first sub-pixel region 101 and the second sub-pixel region 102 for generating a first primary color light L1 in the first sub-pixel region 101 and generating a second primary color light L2 in the second sub-pixel region 102. The second organic light-emitting layer 182 is disposed in the third sub-pixel region 103 and the fourth sub-pixel region 104 for generating a third primary color light L3 in the third sub-pixel region 103 and generating a fourth primary color light L4 in the fourth sub-pixel region 104. The first primary color light L1, the second primary color light L2, the third primary color light L3 and the fourth primary color light L4 have different spectra of wavelength. For example, the first primary color light L1 is a blue light, the second primary color light L2 is a yellow light, the third primary color light L3 is a green light, and the fourth primary color light L4 is a red light, but not limited thereto.

The pixel structure of the electroluminescent display panel 10 further includes at least one first hole transport layer 201, at least one second hole transport layer 202, at least one third hole transport layer 203, at least one fourth hole transport layer 204, and at least one electron transport layer 190. The first hole transport layer 201 is disposed in the first sub-pixel region 101 and between the first anode 121 and the first organic light-emitting layer 181. The second hole transport layer 202 is disposed in the second sub-pixel region 102 and between the second anode 122 and the first organic light-emitting layer 181. The third hole transport layer 203 is disposed in the third sub-pixel region 103 and between the third anode 123 and the second organic light-emitting layer 182. The fourth hole transport layer 204 is disposed in the fourth sub-pixel region 104 and between the fourth anode 124 and the second organic light-emitting layer 182. The electron transport layer 190 is disposed in the first sub-pixel region 101, the second sub-pixel region 102, the third sub-pixel region 103 and the fourth sub-pixel region 104, and between the cathodes (including the first cathode 141, the second cathode 142, the third cathode 143 and the fourth cathode 144) and the organic light-emitting layers (including the first organic light-emitting layer 181 and the second organic light-emitting layer 182). In addition, for improving efficiency of hole and electron injection, the pixel structure of the electroluminescent display panel 10 may optionally include other films such as at least one hole injection layer (not shown) and at least one electron injection layer (not shown).

In this embodiment, the first organic light-emitting layer 181 is a single-layered organic light-emitting layer, which includes a first organic light-emitting material for generating the first primary color light L1, and a second organic light-emitting material for generating the second primary color light L2; the second organic light-emitting layer 182 is also a single-layered organic light-emitting layer, which includes a third organic light-emitting material for generating the third primary color light L3, and a fourth organic light-emitting material for generating the fourth primary color light L4. For example, the first organic light-emitting material and the second organic light-emitting material are a blue organic light-emitting material and a yellow organic light-emitting material, respectively, and the third organic light-emitting material and the fourth organic light-emitting material are a green organic light-emitting material and a red organic light-emitting material, respectively. The first organic light-emitting layer 181 and the second organic light-emitting layer 182 can be formed by a dry process, respectively. For instance, the first organic light-emitting material and the second organic light-emitting material can be formed by a co-evaporation process to form the first organic light-emitting layer 181; the third organic light-emitting material and the fourth organic light-emitting material can also be formed by another co-evaporation process to form the second organic light-emitting layer 182. Alternatively, the first organic light-emitting layer 181 and the second organic light-emitting layer 182 can be formed by a wet process (solution-based process) such as coating process, inkjet process or screen printing process. When displaying, in the first sub-pixel region 101, the first organic light-emitting layer 181 is driven by a potential difference between the first anode 121 and the first cathode 141 to generate the first primary color light L1 and the second primary color light L2; and in the second sub-pixel region 102, the first organic light-emitting layer 181 is driven by a potential difference between the second anode 122 and the second cathode 142 to generate the first primary color light L1 and the second primary color light L2. The cavity lengths of the first micro cavity 161 and the second micro cavity 162 are modified to be different based on the spectra of wavelength of the first primary color light L1 and the second primary color light L2. Specifically, the greater the wavelength is, the greater the cavity length is. Thus, due to micro cavity effect, in the first sub-pixel region 101, the first primary color light L1 can emit out, but the second primary color light L2 cannot emit out; in the second sub-pixel region 102, the second primary color light L2 can emit out, but the first primary color light L1 cannot emit out. Similarly, when displaying, in the third sub-pixel region 103, the second organic light-emitting layer 182 is driven by a potential difference between the third anode 123 and the third cathode 143 to generate the third primary color light L3 and the fourth primary color light L4; and in the fourth sub-pixel region 104, the second organic light-emitting layer 182 is driven by a potential difference between the fourth anode 124 and the fourth cathode 144 to generate the third primary color light L3 and the fourth primary color light L4. The cavity lengths of the third micro cavity 163 and the fourth micro cavity 164 are modified to be different based on the spectra of wavelength of the third primary color light L3 and the fourth primary color light L4. Thus, in the third sub-pixel region 103, the third primary color light L3 can emit out, but the fourth primary color light L4 cannot emit out; in the fourth sub-pixel region 104, the fourth primary color light L4 can emit out, but the third primary color light L3 cannot emit out. Accordingly, by virtue of micro cavity effect, light of different primary colors can be generated in different sub-pixel regions without requiring color filters. The first organic light-emitting layer 181 is not limited to be a single-layered organic light-emitting layer, and can be a composite-layered organic light-emitting layer. For example, the first organic light-emitting layer 181 can be formed by respectively evaporating the first organic light-emitting material and the second organic light-emitting material. Analogically, the second organic light-emitting layer 182 is not limited to be a single-layered organic light-emitting layer, and can be a composite-layered organic light-emitting layer. The second organic light-emitting layer 182 can be formed by respectively evaporating the third organic light-emitting material and the fourth organic light-emitting material.

In this embodiment, the different micro cavity lengths of the first micro cavity 161, the second micro cavity 162, the third micro cavity 163 and the fourth micro cavity 164 are implemented by differentiating the thicknesses of the first hole transport layer 201, the second hole transport layer 202, the third hole transport layer 203 and the fourth hole transport layer 204. For example, when the first primary color light L1 is a blue light, the second primary color light L2 is a yellow light, the third primary color light L3 is a green light, and the fourth primary color light L4 is a red light, the relation of the cavity lengths is as follows: the cavity length of the fourth micro cavity 164 is greater than the cavity length of the second micro cavity 162, the cavity length of the second micro cavity 162 is greater than the cavity length of the third micro cavity 163, and the cavity length of the third micro cavity 163 is greater than the cavity length of the first micro cavity 161. Accordingly, the thickness of the fourth hole transport layer 204 is greater than the thickness of the second hole transport layer 202, the thickness of the second hole transport layer 202 is greater than the thickness of the third hole transport layer 203, and the thickness of the third hole transport layer 203 is greater than the thickness of the first hole transport layer 201.

Figure 2:
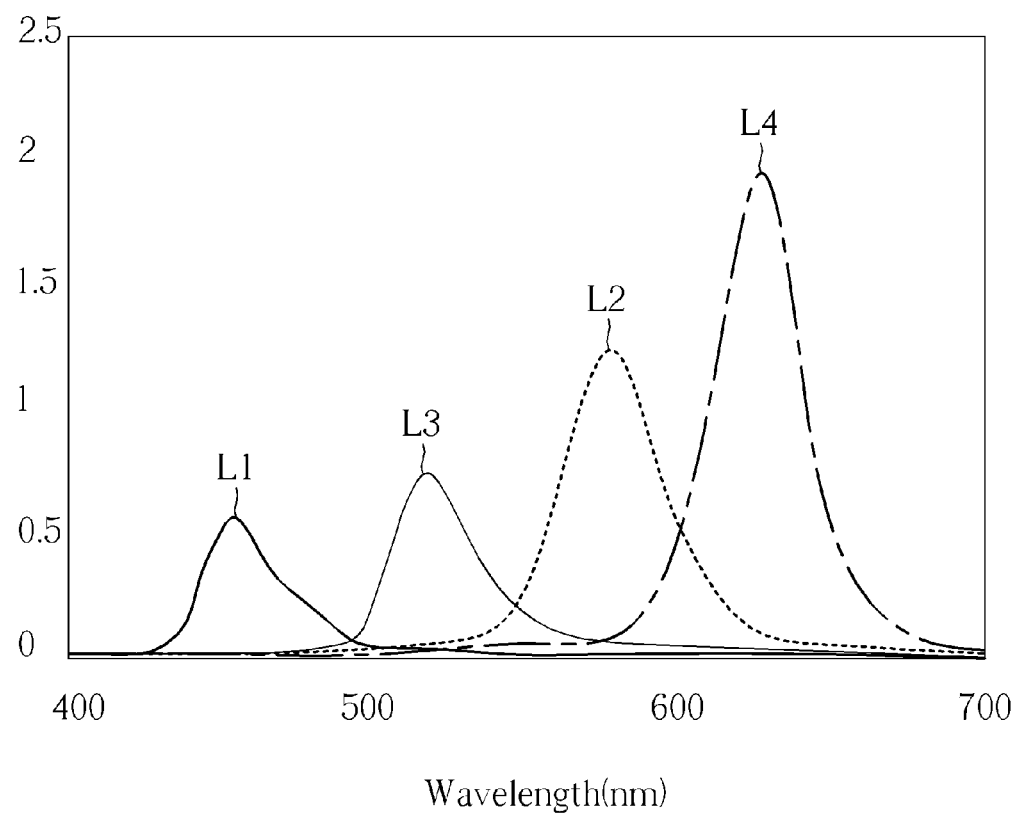
FIG. 2 illustrates a wavelength/intensity relation diagram of light emitted by the pixel structure of the electroluminescent display panel of the first preferred embodiment.

Please refer to FIG. 2, along with FIG. 1. FIG. 2 illustrates a wavelength/intensity relation diagram of light emitted by the pixel structure of the electroluminescent display panel of the first preferred embodiment. As shown in FIG. 2, under micro cavity effect, the pixel structure of the electroluminescent display panel 10 can emit the first primary color light (blue light) L1, the second primary color light (yellow light) L2, the third primary color light (green light) L3 and the fourth primary color light (red light) L4, and thus color gamut can be enlarged. In addition, the spectra of wavelength of the first primary color light (blue light) L1, the second primary color light (yellow light) L2, the third primary color light (green light) L3 and the fourth primary color light (red light) L4 are distinct, and thus color purity and color saturation can be improved. For example, the difference of the peak wavelength of the first primary color light L1 and the peak wavelength of the second primary color light L2 is greater than 50 nanometers, the difference of the peak wavelength of the second primary color light L2 and the peak wavelength of the third primary color light L3 is greater than 50 nanometers, and the difference of the peak wavelength of the third primary color light L3 and the peak wavelength of the fourth primary color light L4 is greater than 50 nanometers, but not limited thereto.

Figure 3:
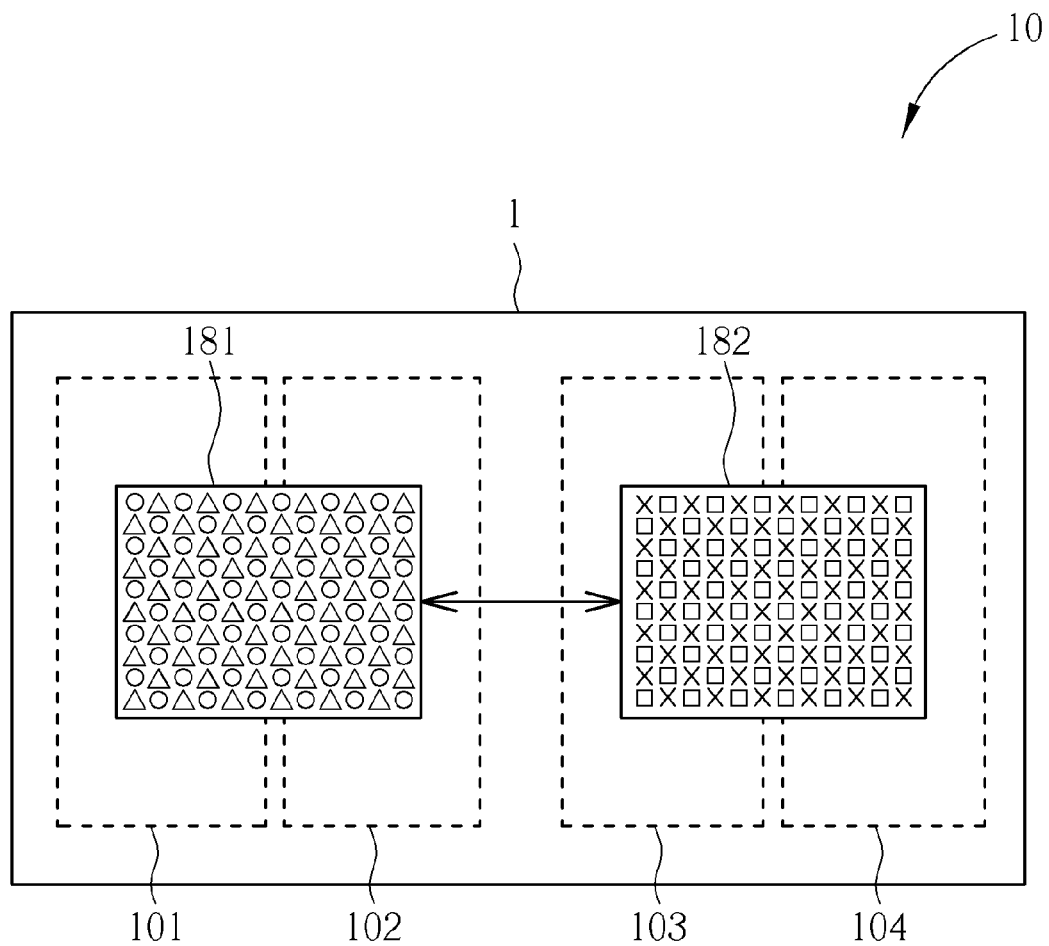
FIG. 3 is a top view illustrating the pixel structure of the electroluminescent display panel of the first preferred embodiment.

Please refer to FIG. 3, along with FIG. 1. FIG. 3 is a top view illustrating the pixel structure of the electroluminescent display panel of the first preferred embodiment. As shown in FIG. 3, the first sub-pixel region 101, the second sub-pixel region 102, the third sub-pixel region 103 and the fourth sub-pixel region 104 are disposed side by side. In addition, the first organic light-emitting layer 181 is a structural layer continuously disposed in the first sub-pixel region 101 and the second sub-pixel region 102; the second organic light-emitting layer 182 is also a structural layer continuously disposed in the third sub-pixel region 103 and the fourth sub-pixel region 104. Therefore, only two fine metal masks (FMMs) are required to form the first organic light-emitting layer 181 and the second organic light-emitting layer 182. Furthermore, since the first sub-pixel region 101 and the second sub-pixel region 102 share the first organic light-emitting layer 181, and the third sub-pixel region 103 and the fourth sub-pixel region 104 share the second organic light-emitting layer 182, the pitch between the first sub-pixel region 101 and the second sub-pixel region 102 and the pitch between the third sub-pixel region 103 and the fourth sub-pixel region 104 can be diminished. Consequently, without increasing panel size or reducing aperture ratio, the number of sub-pixel regions can be increased under the same resolution.

The pixel structure of the electroluminescent display panel is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 4:
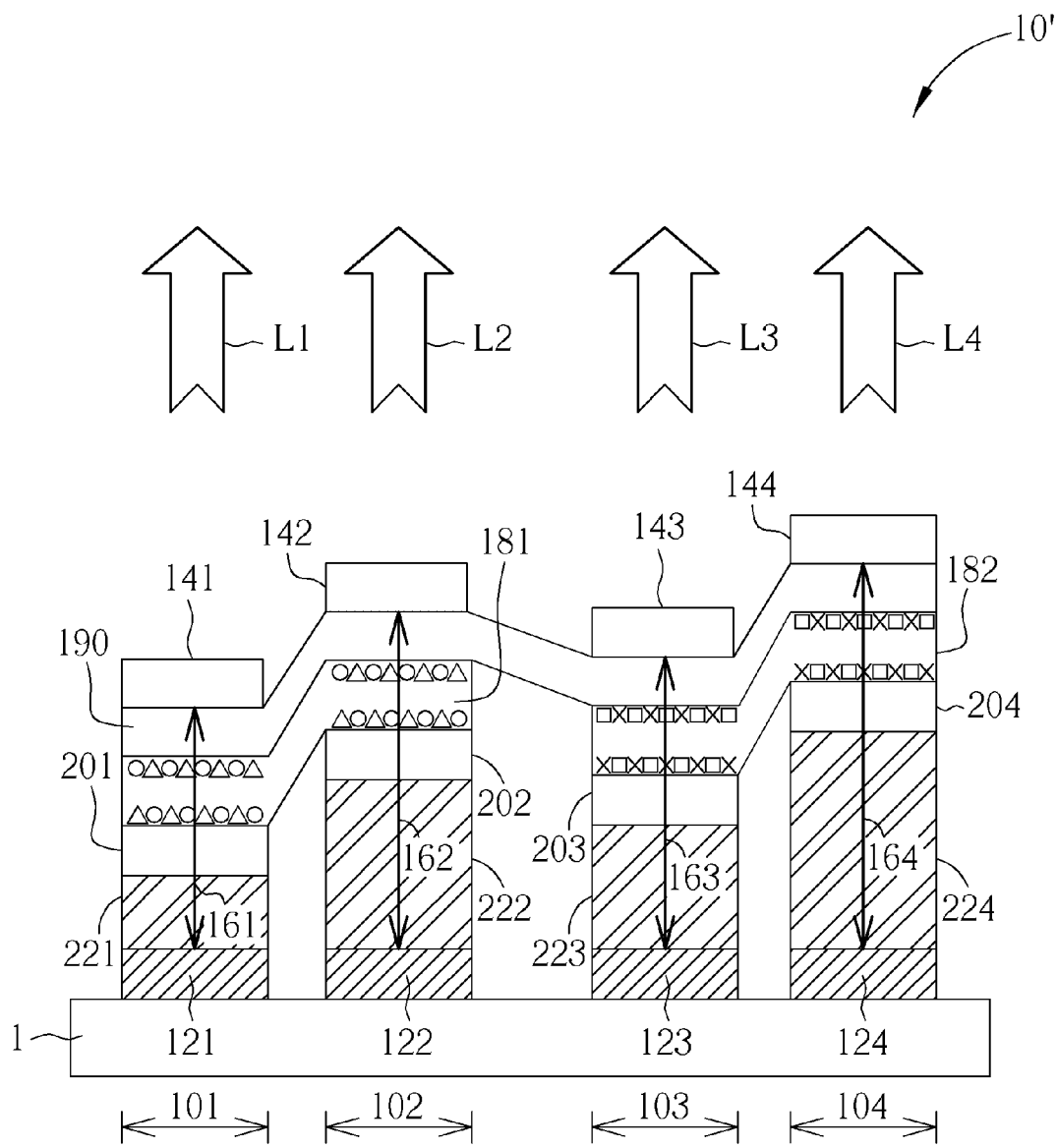
FIG. 4 is a schematic diagram illustrating a pixel structure of an electroluminescent display panel according to a variant embodiment of the first preferred embodiment of this invention.

Please refer to FIG. 4. FIG. 4 is a schematic diagram illustrating a pixel structure of an electroluminescent display panel according to a variant embodiment of the first preferred embodiment of this invention. As shown in FIG. 4, in this variant embodiment, the pixel structure of the electroluminescent display panel 10' is a pixel structure of a top emission type electroluminescent display panel, and the first hole transport layer 201, the second hole transport layer 202, the third hole transport layer 203 and the fourth hole transport layer 204 substantially have the same thickness. In addition, the pixel structure of the electroluminescent display panel 10' further includes at least one first transparent electrode layer 221, at least one second transparent electrode layer 222, at least one third transparent electrode layer 223, and at least one fourth transparent electrode layer 224 disposed in the first sub-pixel region 101, the second sub-pixel region 102, the third sub-pixel region 103 and the fourth sub-pixel region 104, respectively. The first transparent electrode layer 221 is disposed between the first anode 121 and the first hole transport layer 201, the second transparent electrode layer 222 is disposed between the second anode 122 and the second hole transport layer 202, the third transparent electrode layer 223 is disposed between the third anode 123 and the third hole transport layer 203, and the fourth transparent electrode layer 224 is disposed between the fourth anode 124 and the fourth hole transport layer 204. The first transparent electrode layer 221, the second transparent electrode layer 222, the third transparent electrode layer 223 and the fourth transparent electrode layer 224 may be e.g. indium tin oxide (ITO) electrodes of different thicknesses, so as to render the first micro cavity 161, the second micro cavity 162, the third micro cavity 163 and the fourth micro cavity 164 having different cavity lengths. In this invention, the different cavity lengths of the first micro cavity 161, the second micro cavity 162, the third micro cavity 163 and the fourth micro cavity 164 are not limited to be carried out by the aforementioned methods. Other methods such as differentiating the thicknesses of the hole injection layers in different sub-pixel regions or differentiating the thicknesses of the electron injection layers in different sub-pixel regions can be used.

Figure 5:
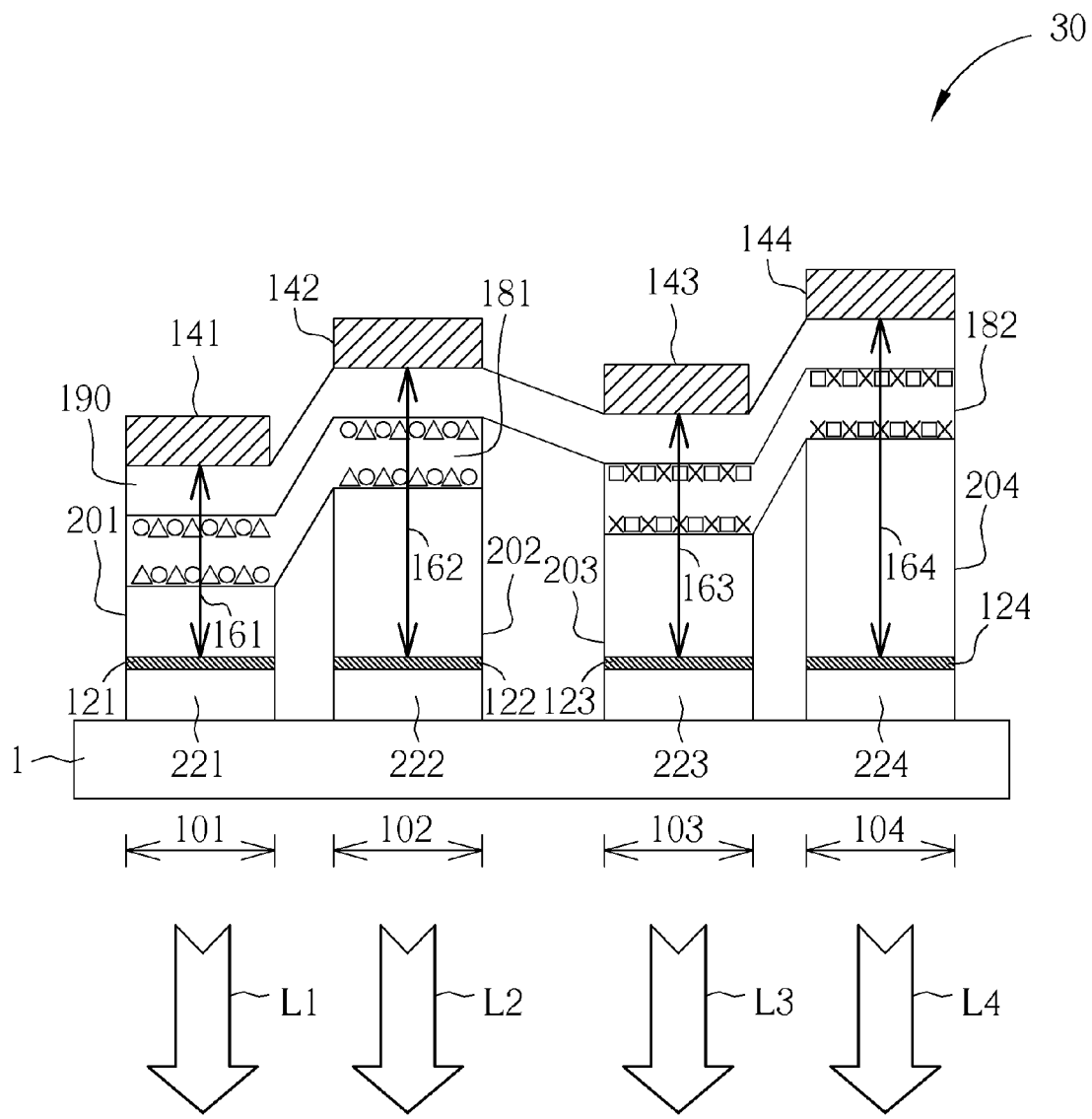
FIG. 5 is a schematic diagram illustrating a pixel structure of an electroluminescent display panel according to a second preferred embodiment of this invention.

Please refer to FIG. 5. FIG. 5 is a schematic diagram illustrating a pixel structure of an electroluminescent display panel according to a second preferred embodiment of this invention. As shown in FIG. 5, the pixel structure of the electroluminescent display panel 30 is a pixel structure of a bottom emission type electroluminescent display panel. Each of the first anode 121, the second anode 122, the third anode 123 and the fourth anode 124 includes a transflective electrode, and each of the first cathode 141, the second cathode 142, the third cathode 143 and the fourth cathode 144 includes a reflective electrode. In this embodiment, the first transparent electrode layer 221 is disposed between the substrate 1 and the first anode 121, the second transparent electrode layer 222 is disposed between the substrate 1 and the second anode 122, the third transparent electrode layer 223 is disposed between the substrate 1 and the third anode 123, and the fourth transparent electrode layer 224 is disposed between the substrate 1 and the fourth anode 124. In this embodiment, the different micro cavity lengths of the first micro cavity 161, the second micro cavity 162, the third micro cavity 163 and the fourth micro cavity 164 are implemented by making the first hole transport layer 201, the second hole transport layer 202, the third hole transport layer 203 and the fourth hole transport layer 204 have different thicknesses, but not limited thereto. For example, in a variant embodiment, the first transparent electrode layer 221 may be disposed between the first anode 121 and the first hole transport layer 201, the second transparent electrode layer 222 may be disposed between the second anode 122 and the second hole transport layer 202, the third transparent electrode layer 223 may be disposed between the third anode 123 and the third hole transport layer 203, and the fourth transparent electrode layer 224 may be disposed between the fourth anode 124 and the fourth hole transport layer 204. In such a case, differentiating the thicknesses of the first transparent electrode layer 221, the second transparent electrode layer 222, the third transparent electrode layer 223 and the fourth transparent electrode layer 224 can also result in the different cavity lengths of the first micro cavity 161, the second micro cavity 162, the third micro cavity 163 and the fourth micro cavity 164.

Figure 6:
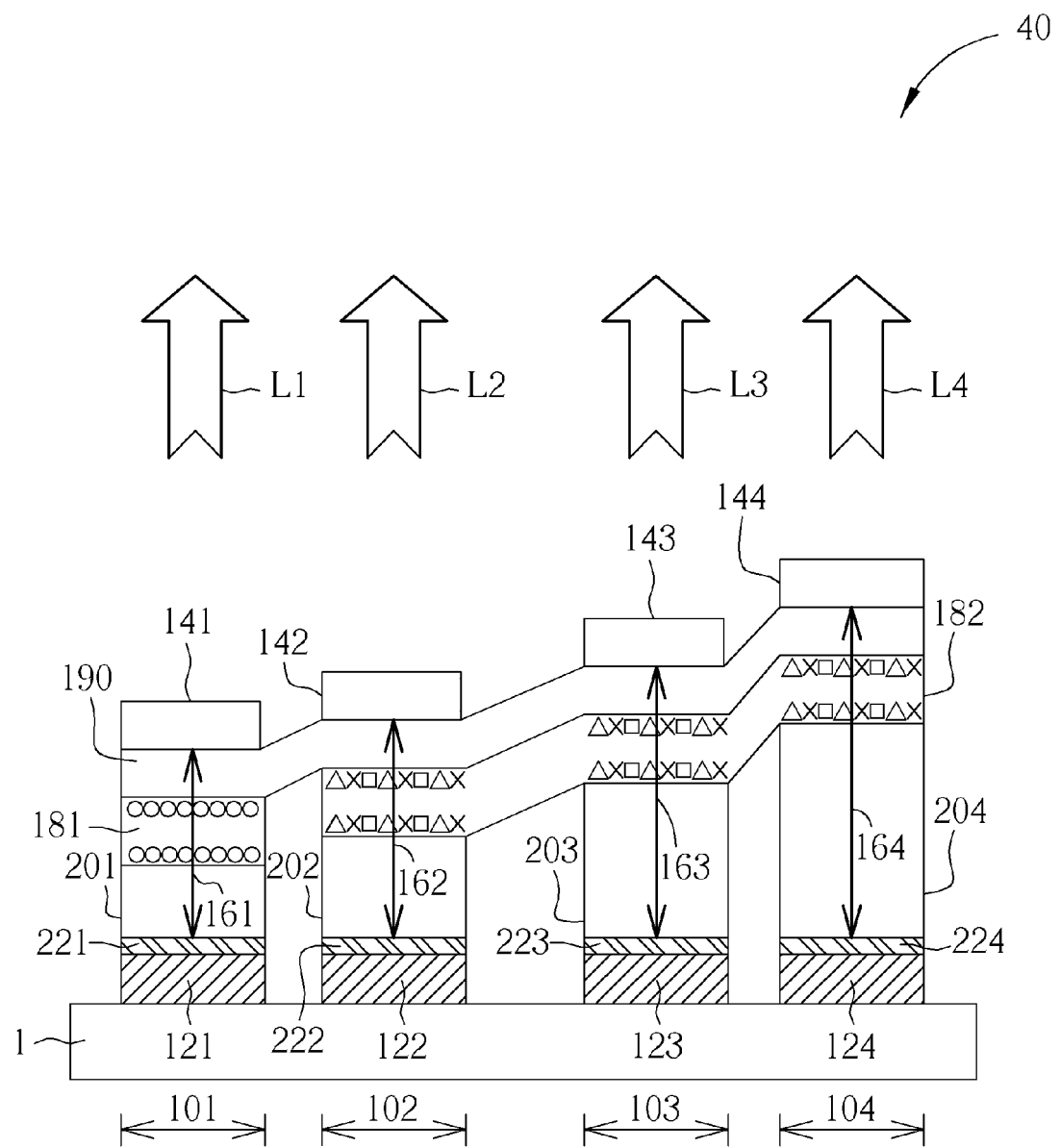
FIG. 6 is a schematic diagram illustrating a pixel structure of an electroluminescent display panel according to a third preferred embodiment of this invention.

Please refer to FIG. 6. FIG. 6 is a schematic diagram illustrating a pixel structure of an electroluminescent display panel according to a third preferred embodiment of this invention. As shown in FIG. 6, different from the first preferred embodiment, in the pixel structure of the electroluminescent display panel 40 of this embodiment, the first organic light-emitting layer 181 is disposed in the first sub-pixel region 101 for generating the first primary color light L1, while the second organic light-emitting layer 182 is disposed in the second sub-pixel region 102, the third sub-pixel region 103 and the fourth sub-pixel region 104 for generating the second primary color light L2 in the second sub-pixel region 102, generating the third primary color light L3 in the third sub-pixel region 103, and generating the fourth primary color light L4 in the fourth sub-pixel region 104. The first primary color light L1, the second primary color light L2, the third primary color light L3 and the fourth primary color light L4 have different spectra of wavelength. For example, in this embodiment, the first primary color light L1 is a blue light, the second primary color light L2 is a green light, the third primary color light L3 is a yellow light, and the fourth primary color light L4 is a red light, but not limited thereto. The electroluminescent display panel in this embodiment is a top emission type electroluminescent display panel, each of the first cathode 141, the second cathode 142, the third cathode 143 and the fourth cathode 144 includes a transflective electrode, and each of the first anode 121, the second anode 122, the third anode 123 and the fourth anode 124 includes a reflective electrode. The pixel structure of the electroluminescent display panel 40 may optionally further include at least one first transparent electrode layer 221, at least one second transparent electrode layer 222, at least one third transparent electrode layer 223, and at least one fourth transparent electrode layer 224 disposed in the first sub-pixel region 101, the second sub-pixel region 102, the third sub-pixel region 103 and the fourth sub-pixel region 104, respectively. The first transparent electrode layer 221, the second transparent electrode layer 222, the third transparent electrode layer 223 and the fourth transparent electrode layer 224 have substantially the same thickness.

In this embodiment, the first organic light-emitting layer 181 is a single-layered organic light-emitting layer, which includes a first organic light-emitting material for generating the first primary color light L1. The second organic light-emitting layer 182 is also a single-layered organic light-emitting layer, which includes a second organic light-emitting material for generating the second primary color light L2, a third organic light-emitting material for generating the third primary color light L3, and a fourth organic light-emitting material for generating the fourth primary color light L4. For example, the first organic light-emitting material is a blue organic light-emitting material, and the second organic light-emitting material, the third organic light-emitting material and the fourth organic light-emitting material are a green organic light-emitting material, a yellow organic light-emitting material and a red organic light-emitting material, respectively. The second organic light-emitting material, the third organic light-emitting material and the fourth organic light-emitting material can be formed by a co-evaporation process to form the second organic light-emitting layer 182. The second organic light-emitting layer 182 may also be a composite-layered organic light-emitting layer, which can be formed by evaporating the second organic light-emitting material, the third organic light-emitting material and the fourth organic light-emitting material respectively. The first micro cavity 161, the second micro cavity 162, the third micro cavity 163 and the fourth micro cavity 164 have different cavity lengths. The first organic light-emitting material is only disposed in the first sub-pixel region 101, and thus only the first primary color light L1 generated by the first organic light-emitting material emits out of the first sub-pixel region 101. Under micro cavity effect, the second primary color light L2 generated by the second organic light-emitting material can only emit out of the second sub-pixel region 102, the third primary color light L3 generated by the third organic light-emitting material can only emit out of the third sub-pixel region 103, and the fourth primary color light L4 generated by the fourth organic light-emitting material can only emit out of the fourth sub-pixel region 104. Accordingly, by virtue of micro cavity effect, light of different primary colors can be generated in different sub-pixel regions without requiring color filters.

In this embodiment, the different micro cavity lengths of the first micro cavity 161, the second micro cavity 162, the third micro cavity 163 and the fourth micro cavity 164 are implemented by differentiating the thicknesses of the first hole transport layer 201, the second hole transport layer 202, the third hole transport layer 203 and the fourth hole transport layer 204. For example, in this embodiment, the first primary color light L1 is a blue light, the second primary color light L2 is a green light, the third primary color light L3 is a yellow light, and the fourth primary color light L4 is a red light, the relation of the cavity lengths is as follows: the cavity length of the fourth micro cavity 164 is greater than the cavity length of the third micro cavity 163, the cavity length of the third micro cavity 163 is greater than the cavity length of the second micro cavity 162, and the cavity length of the second micro cavity 162 is greater than the cavity length of the first micro cavity 161. Accordingly, the thickness of the fourth hole transport layer 204 is greater than the thickness of the third hole transport layer 203, the thickness of the third hole transport layer 203 is greater than the thickness of the second hole transport layer 202, and the thickness of the second hole transport layer 202 is greater than the thickness of the first hole transport layer 201.

Figure 7:
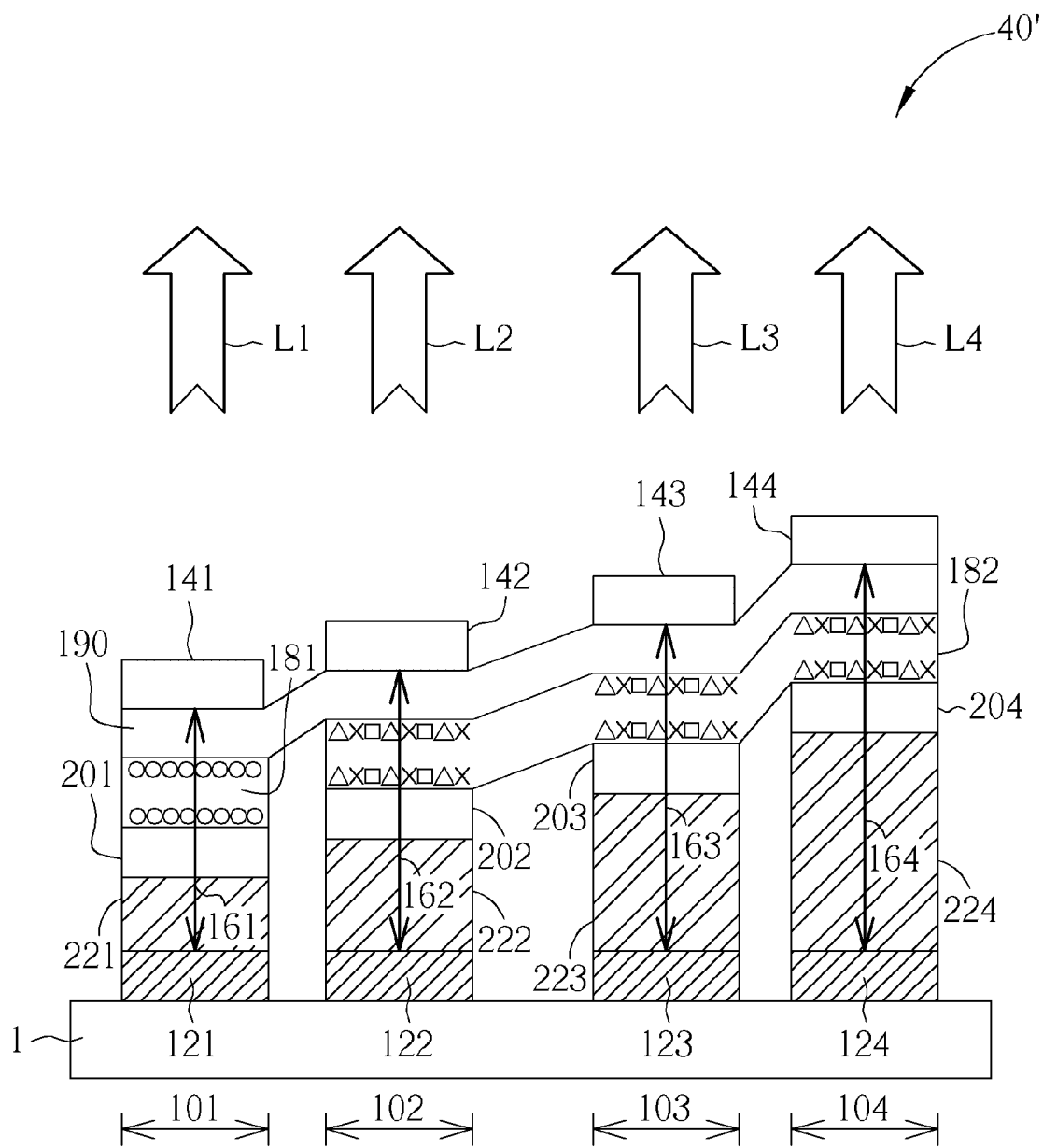
FIG. 7 is a schematic diagram illustrating a pixel structure of an electroluminescent display panel according to a variant embodiment of the third preferred embodiment of this invention.

Please refer to FIG. 7. FIG. 7 is a schematic diagram illustrating a pixel structure of an electroluminescent display panel according to a variant embodiment of the third preferred embodiment of this invention. As shown in FIG. 7, in this variant embodiment, the pixel structure of the electroluminescent display panel 40' is a pixel structure of a top emission type electroluminescent display panel, and the first hole transport layer 201, the second hole transport layer 202, the third hole transport layer 203 and the fourth hole transport layer 204 substantially have the same thickness. In addition, the first transparent electrode layer 221, the second transparent electrode layer 222, the third transparent electrode layer 223 and the fourth transparent electrode layer 224 have different thicknesses, so as to render the first micro cavity 161, the second micro cavity 162, the third micro cavity 163 and the fourth micro cavity 164 having different cavity lengths.

Figure 8:
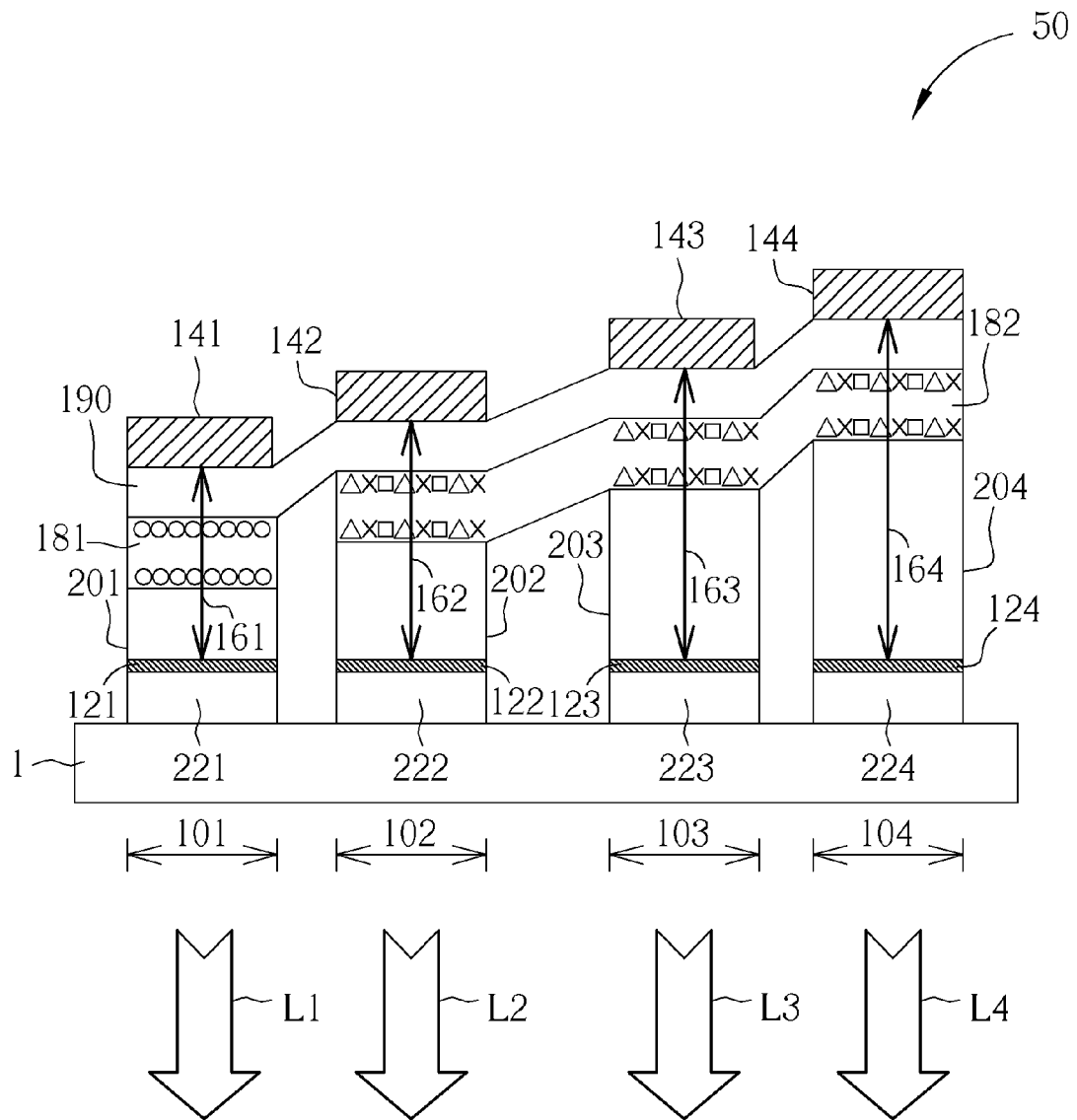
FIG. 8 is a schematic diagram illustrating a pixel structure of an electroluminescent display panel according to a fourth preferred embodiment of this invention.

Please refer to FIG. 8. FIG. 8 is a schematic diagram illustrating a pixel structure of an electroluminescent display panel according to a fourth preferred embodiment of this invention. As shown in FIG. 8, the pixel structure of the electroluminescent display panel 50 is a pixel structure of a bottom emission type electroluminescent display panel. Each of the first anode 121, the second anode 122, the third anode 123 and the fourth anode 124 includes a transflective electrode, and each of the first cathode 141, the second cathode 142, the third cathode 143 and the fourth cathode 144 includes a reflective electrode. In this embodiment, the first transparent electrode layer 221 is disposed between the substrate 1 and the first anode 121, the second transparent electrode layer 222 is disposed between the substrate 1 and the second anode 122, the third transparent electrode layer 223 is disposed between the substrate 1 and the third anode 123, and the fourth transparent electrode layer 224 is disposed between the substrate 1 and the fourth anode 124. In this embodiment, the different micro cavity lengths of the first micro cavity 161, the second micro cavity 162, the third micro cavity 163 and the fourth micro cavity 164 are implemented by differentiating the thicknesses of the first hole transport layer 201, the second hole transport layer 202, the third hole transport layer 203 and the fourth hole transport layer 204, but not limited thereto. For example, in a variant embodiment, the first transparent electrode layer 221 may be disposed between the first anode 121 and the first hole transport layer 201, the second transparent electrode layer 222 may be disposed between the second anode 122 and the second hole transport layer 202, the third transparent electrode layer 223 may be disposed between the third anode 123 and the third hole transport layer 203, and the fourth transparent electrode layer 224 may be disposed between the fourth anode 124 and the fourth hole transport layer 204. In such a case, differentiating the thicknesses of the first transparent electrode layer 221, the second transparent electrode layer 222, the third transparent electrode layer 223 and the fourth transparent electrode layer 224 can also result in the different cavity lengths of the first micro cavity 161, the second micro cavity 162, the third micro cavity 163 and the fourth micro cavity 164.

In conclusion, the pixel structure of the electroluminescent display panel of this invention includes four sub-pixel regions of different colors, and thus color gamut and color saturation can be increased. In addition, at least two adjacent sub-pixel regions share a common organic light-emitting layer. Specifically, the pixel structure of the electroluminescent display panel in this invention only requires two organic light-emitting layers to display a full-color image composed of four different colors. Therefore, without increasing panel size or reducing aperture ratio, the number of sub-pixel regions can be increased under the same resolution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of an electroluminescent display panel having a first sub-pixel region, a second sub-pixel region, a third sub-pixel region and a fourth sub-pixel region, the pixel structure of the electroluminescent display panel comprising:
   a first anode, disposed in the first sub-pixel region;
   a second anode, disposed in the second sub-pixel region;
   a third anode, disposed in the third sub-pixel region;
   a fourth anode, disposed in the fourth sub-pixel region;
   a first organic light-emitting layer, disposed in the first sub-pixel region and the second sub-pixel region, for generating a first primary color light in the first sub-pixel region and generating a second primary color light in the second sub-pixel region;

a second organic light-emitting layer, disposed in the third sub-pixel region and the fourth sub-pixel region, for generating a third primary color light in the third sub-pixel region and generating a fourth primary color light in the fourth sub-pixel region, wherein the first primary color light, the second primary color light, the third primary color light and the fourth primary color light have different spectra of wavelength;

a first cathode, disposed in the first sub-pixel region;

a second cathode, disposed in the second sub-pixel region;

a third cathode, disposed in the third sub-pixel region;

a fourth cathode, disposed in the fourth sub-pixel region; and wherein a first micro cavity is formed between the first anode and the first cathode in the first sub-pixel region, a second micro cavity is formed between the second anode and the second cathode in the second sub-pixel region, a third micro cavity is formed between the third anode and the third cathode in the third sub-pixel region, a fourth micro cavity is formed between the fourth anode and the fourth cathode in the fourth sub-pixel region, and the first micro cavity, the second micro cavity, the third micro cavity and the fourth micro cavity have different cavity lengths.

2. The pixel structure of the electroluminescent display panel of claim 1, wherein the first organic light-emitting layer is a single-layered organic light-emitting layer comprising a first organic light-emitting material for generating the first primary color light and a second organic light-emitting material for generating the second primary color light, the second organic light-emitting layer is a single-layered organic light-emitting layer comprising a third organic light-emitting material for generating the third primary color light and a fourth organic light-emitting material for generating the fourth primary color light.

3. The pixel structure of the electroluminescent display panel of claim 1, further comprising:
  at least one first hole transport layer, disposed in the first sub-pixel region;
  at least one second hole transport layer, disposed in the second sub-pixel region;
  at least one third hole transport layer, disposed in the third sub-pixel region;
  at least one fourth hole transport layer, disposed in the fourth sub-pixel region; and
  wherein the at least one first hole transport layer, the at least one second hole transport layer, the at least one third hole transport layer and the at least one fourth hole transport layer have different thicknesses to render the first micro cavity, the second micro cavity, the third micro cavity and the fourth micro cavity having different cavity lengths.

4. The pixel structure of the electroluminescent display panel of claim 1, further comprising:
  at least one first transparent electrode layer, disposed in the first sub-pixel region;
  at least one second transparent electrode layer, disposed in the second sub-pixel region;
  at least one third transparent electrode layer, disposed in the third sub-pixel region;
  at least one fourth transparent electrode layer, disposed in the fourth sub-pixel region; and
  wherein the at least one first transparent electrode layer, the at least one second transparent electrode layer, the at least one third transparent electrode layer and the at least one fourth transparent electrode layer have different thicknesses to render the first micro cavity, the second micro cavity, the third micro cavity and the fourth micro cavity having different cavity lengths.

5. The pixel structure of the electroluminescent display panel of claim 1, wherein the electroluminescent display panel is a top emission type electroluminescent display panel, each of the first cathode, the second cathode, the third cathode and the fourth cathode comprises a transflective electrode, and each of the first anode, the second anode, the third anode and the fourth anode comprises a reflective electrode.

6. The pixel structure of the electroluminescent display panel of claim 1, wherein the electroluminescent display panel is a bottom emission type electroluminescent display panel, each of the first anode, the second anode, the third anode and the fourth anode comprises a transflective electrode, and each of the first cathode, the second cathode, the third cathode and the fourth cathode comprises a reflective electrode.

7. The pixel structure of the electroluminescent display panel of claim 1, wherein the second sub-pixel region and the third sub-pixel region are disposed adjacent to each other, a difference of a peak wavelength of the first primary color light and a peak wavelength of the second primary color light is greater than 50 nanometers, a difference of the peak wavelength of the second primary color light and a peak wavelength of the third primary color light is greater than 50 nanometers, and a difference of the peak wavelength of the third primary color light and a peak wavelength of the fourth primary color light is greater than 50 nanometers.

8. The pixel structure of the electroluminescent display panel of claim 7, wherein the first primary color light is a blue light, the second primary color light is a yellow light, the third primary color light is a green light, and the fourth primary color light is a red light.

9. The pixel structure of the electroluminescent display panel of claim 2, wherein the first organic light-emitting material and the second organic light-emitting material are a blue organic light-emitting material and a yellow organic light-emitting material, respectively, and the third organic light-emitting material and the fourth organic light-emitting material are a green organic light-emitting material and a red organic light-emitting material, respectively.

10. A pixel structure of an electroluminescent display panel having a first sub-pixel region, a second sub-pixel region, a third sub-pixel region and a fourth sub-pixel region, the pixel structure of the electroluminescent display panel comprising:
  a first anode, disposed in the first sub-pixel region;
  a second anode, disposed in the second sub-pixel region;
  a third anode, disposed in the third sub-pixel region;
  a fourth anode, disposed in the fourth sub-pixel region;
  a first organic light-emitting layer, disposed in the first sub-pixel region, for generating a first primary color light in the first sub-pixel region;
  a second organic light-emitting layer, disposed in the second sub-pixel region, the third sub-pixel region and the fourth sub-pixel region, for generating a second primary color light in the second sub-pixel region, generating a third primary color light in the third sub-pixel region, and generating a fourth primary color light in the fourth sub-pixel region, wherein the first primary color light, the second primary color light, the third primary color light and the fourth primary color light have different spectra of wavelength;
  a first cathode, disposed in the first sub-pixel region;
  a second cathode, disposed in the second sub-pixel region;

a third cathode, disposed in the third sub-pixel region;
a fourth cathode, disposed in the fourth sub-pixel region; and
wherein a first micro cavity is formed between the first anode and the first cathode in the first sub-pixel region, a second micro cavity is formed between the second anode and the second cathode in the second sub-pixel region, a third micro cavity is formed between the third anode and the third cathode in the third sub-pixel region, a fourth micro cavity is formed between the fourth anode and the fourth cathode in the fourth sub-pixel region, and the first micro cavity, the second micro cavity, the third micro cavity and the fourth micro cavity have different cavity lengths.

11. The pixel structure of the electroluminescent display panel of claim 10, wherein the first organic light-emitting layer is a single-layered organic light-emitting layer comprising a first organic light-emitting material for generating the first primary color light, the second organic light-emitting layer is a single-layered organic light-emitting layer comprising a second organic light-emitting material for generating the second primary color light, a third organic light-emitting material for generating the third primary color light, and a fourth organic light-emitting material for generating the fourth primary color light.

12. The pixel structure of the electroluminescent display panel of claim 10, further comprising:
at least one first hole transport layer, disposed in the first sub-pixel region;
at least one second hole transport layer, disposed in the second sub-pixel region;
at least one third hole transport layer, disposed in the third sub-pixel region;
at least one fourth hole transport layer, disposed in the fourth sub-pixel region; and
wherein the at least one first hole transport layer, the at least one second hole transport layer, the at least one third hole transport layer and the at least one fourth hole transport layer have different thicknesses to render the first micro cavity, the second micro cavity, the third micro cavity and the fourth micro cavity having different cavity lengths.

13. The pixel structure of the electroluminescent display panel of claim 10, further comprising:
at least one first transparent electrode layer, disposed in the first sub-pixel region;
at least one second transparent electrode layer, disposed in the second sub-pixel region;
at least one third transparent electrode layer, disposed in the third sub-pixel region;
at least one fourth transparent electrode layer, disposed in the fourth sub-pixel region; and
wherein the at least one first transparent electrode layer, the at least one second transparent electrode layer, the at least one third transparent electrode layer and the at least one fourth transparent electrode layer have different thicknesses to render the first micro cavity, the second micro cavity, the third micro cavity and the fourth micro cavity having different cavity lengths.

14. The pixel structure of the electroluminescent display panel of claim 10, wherein the electroluminescent display panel is a top emission type electroluminescent display panel, each of the first cathode, the second cathode, the third cathode and the fourth cathode comprises a transflective electrode, and each of the first anode, the second anode, the third anode and the fourth anode comprises a reflective electrode.

15. The pixel structure of the electroluminescent display panel of claim 10, wherein the electroluminescent display panel is a bottom emission type electroluminescent display panel, each of the first anode, the second anode, the third anode and the fourth anode comprises a transflective electrode, and each of the first cathode, the second cathode, the third cathode and the fourth cathode comprises a reflective electrode.

16. The pixel structure of the electroluminescent display panel of claim 10, wherein the second sub-pixel region and the third sub-pixel region are disposed adjacent to each other, a difference of a peak wavelength of the first primary color light and a peak wavelength of the second primary color light is greater than 50 nanometers, a difference of the peak wavelength of the second primary color light and a peak wavelength of the third primary color light is greater than 50 nanometers, and a difference of the peak wavelength of the third primary color light and a peak wavelength of the fourth primary color light is greater than 50 nanometers.

17. The pixel structure of the electroluminescent display panel of claim 16, wherein the first primary color light is a blue light, the second primary color light is a green light, the third primary color light is a yellow light, and the fourth primary color light is a red light.

18. The pixel structure of the electroluminescent display panel of claim 11, wherein the first organic light-emitting material is a blue organic light-emitting material, and the second organic light-emitting material, the third organic light-emitting material and the fourth organic light-emitting material are a green organic light-emitting material, a yellow organic light-emitting material and a red organic light-emitting material, respectively.

* * * * *